Nov. 8, 1960 K. KADELBURG ET AL 2,959,718

RECTIFIER ASSEMBLY

Filed April 8, 1957 2 Sheets-Sheet 1

INVENTORS.
KURT KADELBURG &
LOWELL PELFREY
BY D. Gordon Angus
ATTORNEY.

Nov. 8, 1960 K. KADELBURG ET AL 2,959,718

RECTIFIER ASSEMBLY

Filed April 8, 1957 2 Sheets-Sheet 2

INVENTORS.
KURT KADELBURG &
LOWELL PELFREY
BY D Gordon Angus
ATTORNEY 2,959,718
Patented Nov. 8, 1960

2,959,718

RECTIFIER ASSEMBLY

Kurt Kadelburg, West Los Angeles, and Lowell Pelfrey, Manhattan Beach, Calif., assignors to International Rectifier Corporation, El Segundo, Calif., a corporation of California Filed Apr. 8, 1957, Ser. No. 651,514

13 Claims. (Cl. 317—234)

This invention relates to semi-conductor electric elements and more particularly to such elements which utilize a crystalline semi-conductor material as an active substance in the rectifying of electric current.

An object of this invention is to provide a crystal junction semi-conductor electric element which provides for the minimizing of stresses in the crystalline semi-conductor material.

Another object is to provide such a semi-conductor element which has a substantially uniform resistivity.

A related object is to provide for more uniform dissipation of heat from the semi-conductor material of such an element.

Crystal junction semi-conductor elements utilizing germanium wafers, for example, are well known. Providing a barrier layer in such a wafer by applying in a molten state, activating material such as indium, is also a well known process. However, diffusion of the activating material and the semi-conductor material in the process of providing for the barrier layer in this manner has heretofore in many cases not been substantially uniform at all points of contact of the two materials. Furthermore, undesirable stresses which are potentially the cause of failure by breaking are caused in the crystalline semi-conductor due to the different coefficients of expansion of the two materials. Normally, the crystals used have been solid disc shaped wafers and the activating material has been applied over one side of such a wafer. Such a shaped crystal has difficulty in dissipating heat from the center of the junction of the crystalline semi-conductor and the activating material. This difficulty in heat dissipation results in reducing the current rectification capacity of such a rectifier element, since too high a current and too much heat in one area will result in permanent damage to the rectifier element by shorting out the junction.

The invention is carried out by providing a crystalline semi-conductor wafer which has a hole through its center, on one surface of which there is applied an activating material such as indium. The base plate to which the crystalline wafer is attached may also be provided with a centrally located depression which is aligned with the hole in the crystalline wafer. The semi-conductor wafer may, for example, be either of silicon or germanium.

The foregoing and other features will be more readily understood from the following detailed description and accompanying drawings of which:

Figure 1:
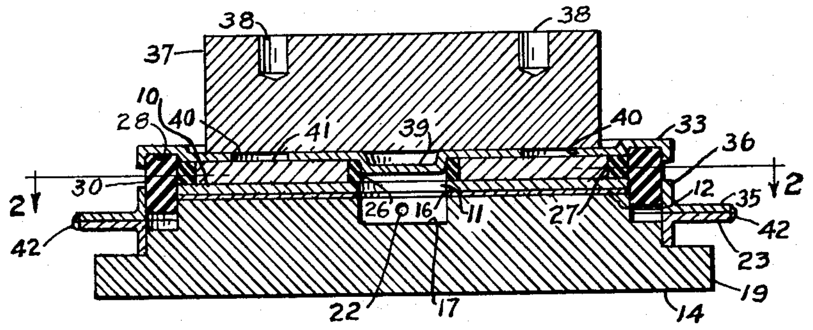
Fig. 1 shows in cross-section a semi-conductor rectifier element according to the invention in position adjacent to a suitable anode block.
Figure 2:
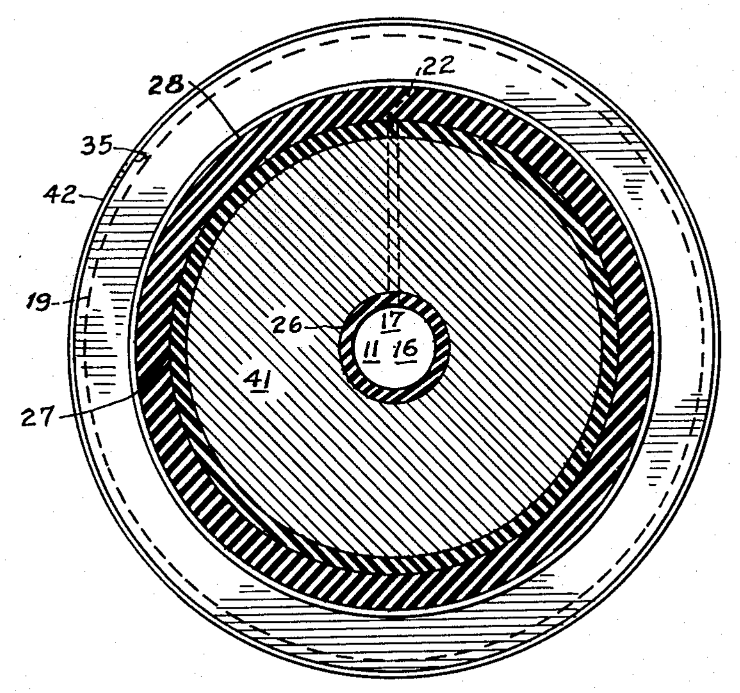
Fig. 2 is a cross-section taken at line 2—2 in Fig. 1.
Figures 3, 4:
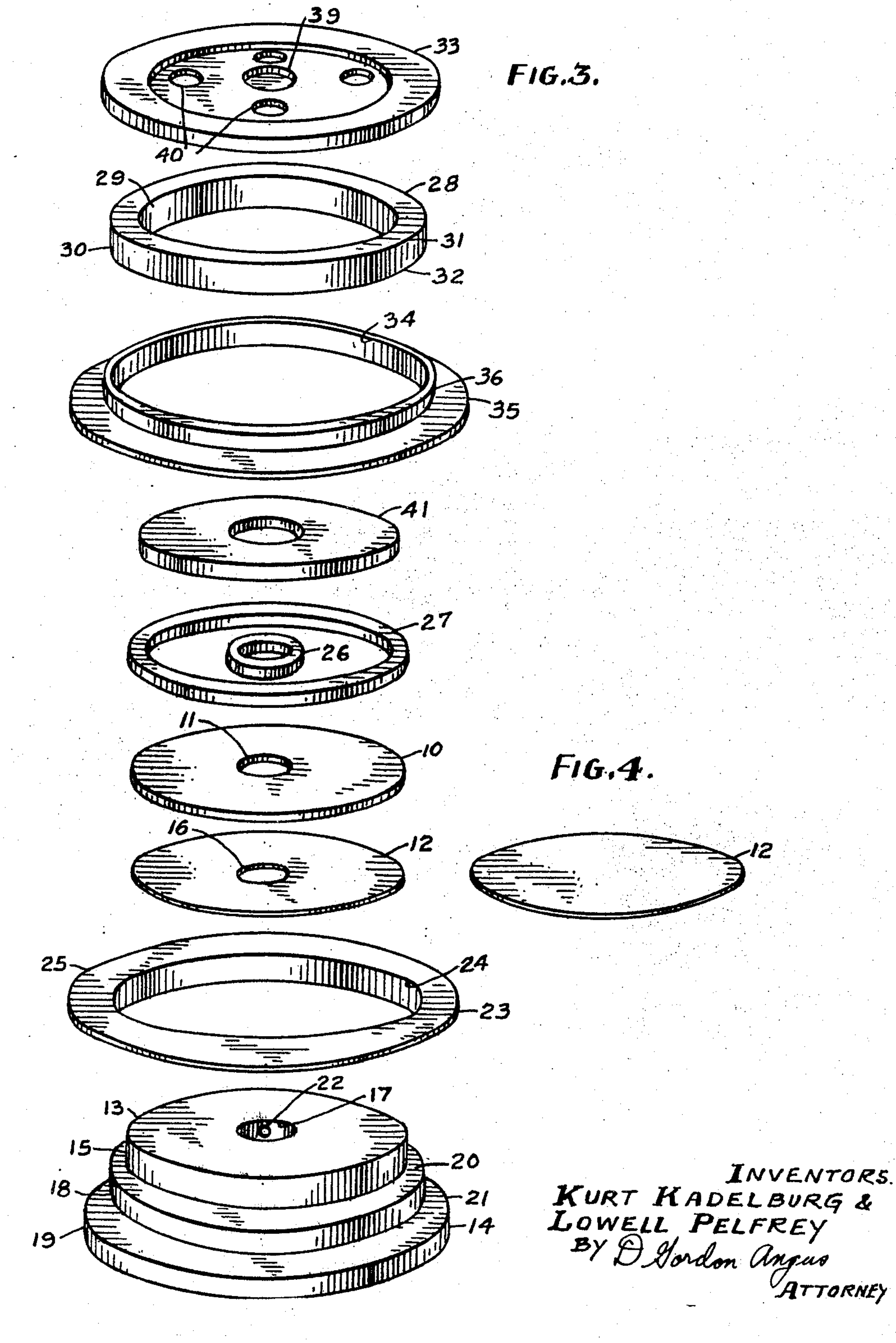
Fig. 3 is an exploded view of the rectifier element of Fig. 1 showing in perspective its individual parts.
Fig. 4 shows a suitable piece of solder, such as the one shown in Fig. 3, as it appears prior to use in the manufacture of the rectifier element of Figs. 1, 2 and 3.

Referring to the rectifier element shown in Figs. 1, 2 and 3 there is shown a crystalline semi-conductor 10, preferably of germanium, in the form of a flat wafer having a hole 11 through its center which opens a substantial area through the wafer. A suitable thin layer of solder 12, preferably a silver solder, is provided on one side of the wafer between the wafer and the upper surface 13 of an electrically conductive base plate 14, preferably of copper. The layer of solder 12 also has a centrally located hole 16 through it when it is in an assembled rectifier element. The upper surface 13 of the base plate has an outer diameter 15 which is concentric about a centrally located depression 17 on said upper surface. The depression 17 comprises a hole which does not go all the way through the base plate and which is of substantially the same diameter as the holes 11 and 16 in the germanium wafer and solder respectively. Two successively larger diameters 18 and 19, concentric with the diameter 15 are also provided on the base plate at successively lower levels, thereby forming flat horizontal lands 20 and 21 which are concentric about the upper surface 13. A hole 22 is provided which extends from within the depression 17 through the surface of the base plate having the diameter 15.

A ring 23, preferably of steel, is provided having an inner wall 24 which fits over the base plate at the diameter 18 where it is soldered around the periphery of the base plate. The ring 23 has a flange 25 around its upper edge which extends outward substantially horizontally.

On the opposite side of the germanium wafer 10 there are provided two concentric inner and outer insulating rings, 26 and 27 respectively, preferably of glass. The inner ring 26 is disposed on top of the wafer 10 around the periphery of the hole 11, so that in effect it forms part of the hole 11, while the outer ring 27 is disposed on top of the wafer 10 within the limits of its outer periphery.

A larger insulating ring 28, preferably of ceramic, having an inner diameter 29, which is large enough to form a loose fit around the outside of the concentric insulating ring 27, is also provided. The insulating ring 28 with an outer diameter 30 is metalized at its upper edge 31 and lower edge 32 with an unmetalized insulating area between the two said edges. The large insulating ring 28, along with a second metal ring 36, also preferably of steel like the first metal ring 23, and a top plate 33 form a cover for the rectifier element. The top plate 33 may conveniently be attached by soldering to the upper metalized edge 31 of the insulating ring 28. The second metal ring 36 also has an inner wall 34 and a flange 35 similar to the wall 24 and flange member 25 on the ring 23, each of said rings being a duplicate of the other. The ring 36, however, is disposed so that its flange 35 is around its lower edge and the internal wall 34 is soldered at the lower metalized area 32 of the ceramic ring. This arrangement permits the top plate 33 to be insulated from the metal ring 36 which is required for such a flanged ring construction, since the metal ring 36 is in electrically conductive contact with the base plate 14 by means of the metal ring 23 which is in contact with both the ring 36 and the base plate 14. The top plate 33, of course, contacts some suitable anode 37, preferably a block of copper, which is shown in proper position in Fig. 1. The anode 37 may conveniently be provided with tapped holes 38 or the like for purposes of attaching some means for holding an electrical lead to the anode. Areas of contact between the anode 37 and the top plate may be provided with a suitable solder to maintain good electrical contact between them.

The top plate 33 is provided with a plurality of holes 40 through it, which are spaced substantially uniformly over a portion of the surface of said top plate lying between the pair of concentric insulating rings 26 and 27. The top plate 33 also has a centrally located small circular indentation 39 which protrudes downward and fits within the small insulating ring 26, thereby centrally positioning the small insulating ring 26 with respect to the top plate 33 and of course also positioning it around the center hole 11 in the germanium wafer as has been previously mentioned. The pair of concentric insulating rings 26 and 27 are of sufficient thickness in their axial direction to extend from the germanium wafer 10 to the top plate 33 when the two metal flanges 23 and 36 are brought together, as best shown in Fig. 1. An activating material 41 in the shape of an annulus is situated in the space between the top plate 33 and the germanium wafer 10 and within the pair of concentric rings 26 and 27 to provide the desired P–N junction at said germanium wafer. Indium is preferred for material 41 when a germanium wafer is used, and aluminum is preferred when a silicon wafer is used. However, material 41 can be of any P-type material. More particularly, it can be any of the metals of group III, of the periodic table, or alloys of said metals, or alloys including said metals. The germanium or silicon is the "N" part of the P–N junction, and the activating material is the "P" part.

It is to be understood that Fig. 3 is an exploded view of the manufactured rectifier element of Fig. 1. In actual practice the rectifier element is assembled in the manner previously discussed and the flanges 25 and 35 of the metal rings 23 and 36 respectively are welded together at their peripheries at 42, as shown in Fig. 1. The thin layer of solder 12, however, when placed in position at the beginning of the manufacturing process actually is a thin solid disc as shown in Fig. 4. The crystalline wafer 10 is a substantially pure semi-conductor material commercially available. The wafer 10 may be of any suitable size and shape and since its method of assembly is well known in the art, its manufacture is not here discussed in detail.

The activating material 41 of indium, at the beginning of manufacture of the rectifier element of this invention can actually be in the form of several solid sticks of indium, there being one of said sticks placed in fixed position above each of the holes 40 in the top plate. The indium sticks may be held in a holder comprised of a graphite jig which may be subjected to temperatures high enough to melt the indium but not to damage the jig. The assembled rectifier element should also be placed in a suitable jig which is held in fixed relationship with the graphite jig containing the indium sticks. They are then placed in a suitable furnace where the furnace heat melts the indium which is directed through the holes 40 and at the same time the solder layer 12 between the germanium wafer 10 and base plate 14 is melted which attaches the germanium to the base plate and leaves the disc of solder, shown in Fig. 4, in the shape of the solder layer 12 shown in Fig. 3. The solder material from the hole 16 in the solder layer 12 and other excess solder flows into the depression 17 in the base plate and some molten solder passes through the horizontal hole 22 in the base plate to the concentric land 20 where this molten solder hardens and thereby better attaches the base plate to the metal ring 23. The solid indium sticks are chosen so their combined volume nearly exactly fills the otherwise vacant air space above the germanium. The molten indium and germanium diffuse where they meet to form an alloy which constitutes the barrier layer required in all rectifier elements of this type. The operation of melting the indium in a furnace in juxtaposition with the rectifier element hermetically seals the rectifier element. The anode block 37, as has been previously discussed, is applied later in a separate operation.

A rectifier element constructed according to this invention in which a hole is provided through the middle of the rectifier crystal has several advantages not present in rectifier elements previously known. The stresses caused in the rectifier crystal by the different co-efficients of expansion of the activating material and the rectifier crystal are minimized to a greater extent in the rectifier element of this invention, as compared with a rectifier element utilizing a crystal without a hole through it. This comes about because the crystal material at the hole area is omitted, and this area being where most stresses ordinarily occur since the middle cools last, the greater amount of concentrated stresses are thereby eliminated when the material is omitted at the hole area.

Another advantage of the rectifier element of the construction disclosed in this invention is that a more uniform resistivity is created through the rectifier crystal. Ordinarily in a rectifier element having a solid crystal without a hole through its center, resistivity is different at the center than at the outside since diffusion of the activating material and rectifier crystal occurs deeper at the center than at the outside. With the inside removed, the diffusion depth is easier to control since a molten activating material applied concentrically around a central hole of a rectifier crystal gives greater uniformity of distribution of the diffusion. Without a central hole the diffusion might take place right through to a rectifier element base plate which would result in failure of the rectifier element by shorting through its central area.

A further advantage is the more adequate dissipation of heat from a crystal having a hole through it. Ordinarily, without a hole, it is harder to remove heat from the center of a body than away from its outside. A hole essentially provides another exposed surface of the crystal from which heat will be dissipated. The hole also provides a vacant air space so that no damaging heat concentrations will occur in the material of the rectifier crystal's center. In rectifier elements heretofore known, providing crystal material at such an area easily subject to heat damage and subsequent shorting out had effect on the entire crystal's usefulness. By removing the material at the area subject to such damage, the excessive heat concentration and its accompanying ultimate rectifier element failure problem is thereby avoided.

Although a specific embodiment of this invention has been shown and described in which a germanium wafer semi-conductor has been used, it is to be understood that a silicon crystal could just as well be used in the construction.

While only one embodiment of our invention has been shown in the drawings and described in detail, it is our desire that our invention should not be limited to this particular embodiment, but only in accordance with the following claims, since persons skilled in the art may device other forms of this invention still within the limitations of said claims.

We claim:

1. A rectifier element comprising an electrically conductive base plate, a semi-conductor crystal having a plurality of sides one of its sides being in contact with said base plate, a conductive activating material in contact with a side of said crystal opposite said base plate, a hole through said crystal and a hole through said activating material, each of said holes being so disposed and arranged as to be substantially in alignment, said aligned holes extending from said base plate through said crystal and through said activating material, whereby stresses in the crystal are minimized and substantially uniform resistivity through the crystal is provided, and heat is dissipated from the interior of the rectifier.

2. A rectifier element comprising an electrically conductive base plate having a depression on one of its sides, a semi-conductor crystal having a plurality of sides, a first of which is in contact with the side of the base plate having said depression, a conductive activating material in contact with a second side of said crystal opposite said base plate, a hole through said crystal and a hole through said activating material, each of said holes being so disposed and arranged as to be substantially in alignment, said pair of aligned holes extending from the depression in said base plate through said crystal and through said activating material, whereby stresses in the crystal are minimized and substantially uniform resistivity through the crystal is provided, and heat is dissipated from the interior of the rectifier.

3. Apparatus according to claim 2 in which said holes through the semi-conductor crystal and the activating material and the depression in said base plate are each centrally located in the crystal and the activating material and the base plate respectively.

4. Apparatus according to claim 2 in which a passageway extends from said depression through said base plate to the periphery of said base plate so that excess molten materials melted during the assembly of said rectifier element may thereby be partly removed from said depression.

5. Apparatus according to claim 4 wherein an electrical insulator is disposed and arranged so as to contact said base plate and said semi-conductor crystal at their respective peripheries, thereby maintaining said hole through said semi-conductor crystal in alignment with said depression in said base plate.

6. Apparatus according to claim 5 wherein means is provided attaching said insulator to said base plate thereby maintaining said insulator at its peripheral position with respect to said base plate and said semi-conductor crystal.

7. Apparatus according to claim 6 in which said means attaching said insulator comprises a pair of metal rings, one of which is permanently attached to said base plate, the other of which is permanently attached to said insulator, each of said rings being so disposed and arranged as to contact one another at least at a plurality of positions around the periphery of said base plate, whereby said pair of metal rings are thereby positioned so as to be attachable to one another.

8. A rectifier element comprising an electrically conductive base plate having a depression on one of its sides, a semi-conductor crystal having one of its sides in contact with the side of the base plate having said depression, a conductive activating material in contact with the side of said crystal opposite said base plate, a hole through said crystal and a hole through said activating material, each of said holes being so disposed and arranged as to be substantially in alignment, said pair of aligned holes extending from the depression in said base plate through said crystal and through the activating material to the side of said material which is opposite its side contacting said semi-conductor crystal, said pair of holes and said base plate depression each being centrally located in the crystal and the activating material and the base plate respectively, an insulator contacting said base plate and semi-conductor crystal and activating material at their peripheries, a pair of metal rings attaching said insulator to said base plate, one of said metal rings being attached at the periphery of said insulator, the other of said metal rings being attached at the periphery of said base plate, a second insulator ring disposed concentrically within said first insulator ring and on top of said semi-conductor crystal at its periphery, and a third insulator ring disposed concentrically about said hole through said semi-conductor crystal on top of said semi-conductor crystal, said activating material being disposed within said second insulator and without said third insulator ring in a position between said second and third insulator rings.

9. Apparatus according to claim 8 in which an electrically conductive top plate is disposed and arranged over the first insulator ring, the second insulator ring, the third insulator ring and the conductive activating material so as to form a cover thereto in electrically conductive contact with said activating material.

10. Apparatus according to claim 9 in which said top plate is provided with a plurality of holes substantially uniformally disposed on said top plate over the area at which said activating material is disposed, said top plate having a central depression for maintaining said third insulator ring in position around the periphery of said hole through the semi-conductor crystal, said top plate being of sufficient size so as to extend at least beyond the peripheral limits of said first insulator ring, said top plate being attached to said first insulator ring at positions so as to be electrically insulated from said pair of metal rings.

11. Apparatus according to claim 10 in which an electrically conductive anode contacts the side of said top plate which is opposite its side contacting said conductive activating material.

12. Apparatus according to claim 11 in which said anode comprises a copper block having means for attaching an electrical lead.

13. Apparatus according to claim 11 in which said semi-conductor is of germanium and said activating material is of indium.

References Cited in the file of this patent

UNITED STATES PATENTS

| | | |
|---|---|---|
| 2,826,725 | Roberts | Mar. 11, 1958 |
| 2,827,599 | Jochems | Mar. 18, 1958 |